METALLIZATION OF INSULATING SUBSTRATES

Filed Jan. 3, 1967 2 Sheets-Sheet 1

INVENTORS
FREDERICK W. SCHNEBLE, JR.
EDWARD J. LEECH
JOSEPH POLICHETTE

BY
MORGAN, FINNEGAN, DURHAM & PINE

ATTORNEYS

METALLIZATION OF INSULATING SUBSTRATES

Filed Jan. 3, 1967 2 Sheets-Sheet 2

INVENTORS
FREDERICK W. SCHNEBLE, JR.
EDWARD J. LEECH
JOSEPH POLICHETTE

BY
MORGAN, FINNEGAN, DURHAM & PINE

ATTORNEYS

United States Patent Office 3,560,257 Patented Feb. 2, 1971

3,560,257

METALLIZATION OF INSULATING SUBSTRATES

Frederick W. Schneble, Jr., and Edward J. Leech, Oyster Bay, and Joseph Polichette, South Farmingdale, N.Y., assignors to Photocircuits Division of Kollmorgen Corporation, Hartford, Conn., a corporation of New York Filed Jan. 3, 1967, Ser. No. 606,919
Int. Cl. B44d *1/14, 1/34, 1/18*
U.S. Cl. 117—212 21 Claims

ABSTRACT OF THE DISCLOSURE

A method for rendering insulating compositions receptive to the deposition of an electroless metal is provided which comprises utilizing in such compositions an organic compound of a metal which is a member selected from the metals in Groups 1–B and 8 of the Periodic Table of Elements, including mixtures of such compounds.

This invention relates to materials and techniques for metallizing insulating substrates generally and for the manufacture of printed circuits particularly.

It is an object of the present invention to provide new and improved insulating blanks which are catalytic to the reception of electroless metal and which can be metallized directly, thereby obviating the necessity for seeding and/or sensitizing.

Another object of this invention is to make rugged and durable metallized objects from such catalytic insulating blanks.

A further object of this invention is to make printed circuit boards from such blanks, including one-layer, two-layer and multi-layer boards.

A further object of this invention is to make from such blanks printed circuit boards, including one-layer, two-layer and multi-layer boards, which are provided with conductive passageways.

An additional object of this invention is to provide materials and techniques for producing high density printed circuit boards, including high density one-layer, two-layer and multi-layer boards which are provided with conductive passageways, or, as more commonly referred to, plated through holes.

Still a further object of this invention is to provide materials and techniques for producing new and improved printed circuit armatures.

Heretofore, in the manufacture of printed circuit boards comprising conductive passageways or holes through insulating panels, it has been customary to seed and sensitize the lateral walls surrounding the passageways or holes by contacting a perforated substratum sequentially with aqueous acidic solutions of stannous tin ions and precious metal ions, e.g., palladium, or with a single acidic aqueous solution comprising a mixture of stannous tin ions and precious metal ions, such as palladium ions. For example, one such treatment involves immersing the perforated insulating base material first in an aqueous solution of stannous chloride having a pH of about 6.6 to 7.4, followed by washing, after which the substratum is immersed in an acidic aqueous solution of palladium chloride having a pH of about 4.8 to 5.4. In an alternate system, the perforated substratum is simply immersed in a one-step seeder sensitizer acidic aqueous solution comprising a mixture of stannous chloride and palladium chloride.

Such aqueous seeding and sensitizing solutions have important limitations. Hydrophobic plastics cannot be readily wetted with such solutions and therefore the sensitization achieved with such materials is ordinarily less than satisfactory. When such aqueous seeding and sensitizing solutions are utilized to sensitize lateral walls of the holes or passageways in panels provided with metal foil on one or more surfaces of the panel, the bond between the hole plating and the surface foil tends to be weak. This is so because use of such seeding and sensitizing systems result in depositing a seeder layer on the surface foil, including the edges thereof which surround the holes. This seeder layer interferes with the bond between the surface foil edges surrounding the holes and electroless metal deposited simultaneously on the edges and on the walls surrounding the holes. It is also frequently necessary to superimpose additional metal on the foil adhered directly to the substratum for a variety of reasons. Thus, the initial foil may not be thick enough for the desired printed circuit component and additional metal may therefore have to be added to thicken the pattern. Alternatively, it is frequently necessary to superimpose on the metal cladding a layer of a different metal in order to impart special characteristics to the circuit. Typically, metals such as nickel, gold, silver and rhodium, including mixtures of such metals, are electroplated or electrolessly deposited on an initial layer of copper foil or cladding during the manufacture of printed circuits from copper clad laminates. When the aqueous seeding and sensitizing solutions of the type described are utilized in the manufacture of such circuits, the bond between the copper and the metal subsequently superimposed on the copper also tends to be weak. Here again, the weakness is attributable to the intermediate seeder layer formed on the metal cladding by the seeder-sensitizer solutions of the type described.

As will be clear from the following description, use of the catalytic blanks and compositions of the present invention eliminates the need for such conventional seeding and/or sensitizing solutions and therefore eliminates the problems concomitant with the use thereof. Very importantly, use of the catalytic blanks and compositions of this invention insures a strong bond between the laminate foil bonded to the catalytic blank and electroless metal deposited on the blank, e.g., on walls surrounding holes, since no intermediate seeder layer is present to interfere with the bond. Also important is the fact that use of these catalytic blanks and compositions leads to the achievement of uniformly high bond strengths between the insulating substratum itself and the electroless metal deposit.

Other objects and advantages of the invention will be set forth in part herein and in part will be obvious herefrom or may be learned by practice with the invention, the same being realized and attained by means of the instrumentalities and combinations pointed out in the appended claims.

The invention consists in the novel parts, constructions, arrangements, combinations and improvements herein shown and described. The accompanying drawings referred to herein and constituting a part hereof, illustrate certain embodiments of the invention and together with the specification serve to explain the principles of the invention.

The compositions of the present invention represent an improvement over the seeding and/or sensitizing systems heretofore employed. They are extremely easy to prepare, are readily responsive to deposition when exposed to electroless metal baths; are adaptable to a wide variety of substrata and processing conditions; and are also quite economical.

Very importantly, the compositions of this invention utilize relatively small amounts of catalytic metals of Groups 1–B and 8 of the Periodic Table of Elements and thus permit efficient utilization of such metals generally, and the precious metals in those groups particularly.

The seeding systems of the present invention are also non-conducting in nature, thereby rendering them highly useful for making printed circuits by both positive and negative print techniques.

The catalytic compositions of the present invention comprise organo-metallic compounds which contain a metal or compound of a metal selected from Groups 1–B or 8 of the Periodic Table of Elements which is catalytic to the reception of electroless metal. Preferred metals from the aforesaid groups are gold, silver, platinum, palladium, rhodium, tin, copper and iridium.

The organo-metallic compounds or complexes are reaction products or chemical complexes formed by reacting or complexing a metal or compound containing a metal of Groups 1–B or 8 of the Periodic Table of Elements, with a suitable organic compound.

Preferably, there will be selected for use herein a relatively high molecular weight organo-metallic compound or complex which has associated therewith a comparatively small percentage by weight of the Groups 1–B or 8 metal. Selection of such materials leads to a considerable cost savings, especially when the Groups 1–B or 8 metal is a noble metal, such as gold, silver, palladium and platinum.

The organo-metallic compounds or complexes of this invention may themselves be formed into catalytic bases, catalytic adhesives, catalytic inks or other suitable catalytic composition forms which are capable of being metallized directly upon exposure to electroless metal deposition solutions. Alternatively, such compounds or complexes could be admixed with or dissolved in suitable extending media to form or to coat substrata to thereby render them sensitive to the electroless deposition of metal.

Suitable extenders for the organo-metallic compounds are carboxylic acids, alcohols, acyl halides, ketones, esters, sulfoxides, amines and the like.

Typical of the ketones are acetone, methylethyl ketone, methyl isobutyl ketone, mesityl oxide, di-isobutyl ketone, ethyl butyl ketone and isophorone.

The alcohols which may be used as extenders or solvents include primary, secondary and tertiary monohydric alcohols, and also polyhydric alcohols. Typical are methyl alcohol, ethyl alcohol, isopropyl alcohol, n-propyl alcohol, butyl alcohol, secondary butyl alcohol, isobutyl alcohol, methyl isobutyl carbinol. Preferred for use are the long chain alcohols, such as iso-octyl alcohol.

Typical of the polyhydric alcohols, i.e., alcohols which have more than one hydroxyl group, are ethylene glycol, trimethylene glycol, tetramethylene glycol, pentamethylene glycol, hexamethylene glycol, heptamethylene glycol, glycerol and the like.

Carboxylic acids which may be used as solvents or extenders for the organo-metallic compounds or complexes include formic acid, acetic acid, propionic acid, n-butyric acid, isobutyric acid, n-caproic acid, n-heptoic acid, caprylic acid and n-nonylic acid. Also may be used halogen acids such as dichloroacetic acid. Dicarboxylic acids as well as polycarboxylic acids and also acid anhydrides and acyl halides may also be used.

Among the aldehydes that could serve as the extender or solvent may be mentioned acetaldehyde, propionaldehyde, n-butyraldehyde, isobutyraldehyde, n-vaelearaldehyde, n-capronaldehyde, n-heptaldehyde, and the like.

Also suitable for extending the organo-metallic compounds or complexes are amines, including primary, secondary and tertiary amines. Typical of the amines are methyl amine, dimethyl amine, trimethyl amine, ethyl amine, and n-propyl amine. Also may be mentioned polyamines having two or more primary nitrogens such as ethylene diamine, propylene diamine, diethylene triamine, dipropylene triamine, triethylenetetraamine, tetraethylene pentamine, tetrapropylene pentamine and mixtures of the foregoing. Also suitable as the solvent are amides, including polyamides, amido-amines, and poly-amido-amines. Typical of the amides are formamide, acetamide, propionamide and butyramide.

The amides, polyamides, amido-amines and poly-amido-amines which may serve as the extender or solvent are condensation products of monocarboxylic acids, polycarboxylic acids, or mixtures of monocarboxylic acids and polycarboxylic acids of the type described with amines and polyamines of the type described.

Also as the extender may be used heterocyclic nitrogen containing compounds such as pyrrole, pyrrolidone, piperidine, pyridine and the like; sulfur containing organic compounds such as dimethyl sulfoxide; halogenated hydrocarbons such as methylene chloride, propylene chloride; ethers, such as ethyl ether, methyl ether, and propyl ether; and esters, such as ethyl formate, methyl acetate, n-butyl acetate, n-amyl acetate, isoamyl acetate, methyl propionate and the like.

As the extender may also be used substituted and unsubstituted hydrocarbons of the alkane, alkene and alkyne series, and also substituted and unsubstituted hydrocarbons of the aromatic series.

Organic resins may also serve as extenders or solvents for the organo-metallic compounds, including thermosetting resins, thermoplastic resins and mixtures of the foregoing.

Among the thermoplastic resins may be mentioned the acetal resins: acrylics, such as methyl acrylate; cellulosic resins, such as ethyl cellulose, cellulose acetate, cellulose propionate, cellulose acetate butyrate, cellulose nitrate and the like; chlorinated polyethers; nylon; polyethylene and polypropylene; polystyrene; styrene blends, such as acrylonitrile styrene co-polymer and acrylonitrile-butadiene-styrene co-polymers; polycarbonates; polychlortrifluoroethylene; and vinyl polymers and co-polymers, such as vinyl acetate, vinyl alcohol, vinyl butyral, vinyl chloride, vinyl chloride-acetate-co-polymer, vinylidene chloride, and vinyl formal.

Among the thermosetting resins which may be mentioned are allyl phthalate; furane; melamine-formaldehyde; phenol formaldehyde and phenol-furfural co-polymer, alone or compounded with butadiene acrylonitrile co-polymer or acrylonitrile-butadiene-styrene co-polymers; polyacrylic esters; silicones; urea formaldehydes; epoxy resins; allyl resins; glyceryl phthalates; polyesters, and the like.

For the manufacture of printed circuits, advantageous results are achieved, when the resin system containing the organo-metallic compound comprises a flexible adhesive resin, preferably in combination with a thermosetting resin. Typical of the thermosetting resins which may be used in such systems are the phenolic type resins and polyester resins. The polyester resins are ordinarily dissolved in styrene monomer and cross-linked by reaction with the styrene. As the thermosetting resins may also be mentioned epoxy resins. Typical of the flexible adhesive resins which may be used in such a system are the flexible adhesive epoxy resins, polyvinyl acetal resins, polyvinyl alcohol, polyvinyl acetate, and the like. Preferably, the adhesive resin will be a natural or synthetic rubber, such as chlorinated rubber, butadiene acrylonitrile co-polymer rubber, or an acrylic polymer or co-polymer.

The adhesive resins of the type described have appended thereto polar groups, such as nitrile, epoxide, acetal and hydroxyl groups. Such adhesive resins copolymerize with and plasticize thermosetting resins, and impart good adhesive characteristics through the action of the polar groups.

The organic compounds and resins heretofore described could also be reacted with metals or compounds of metals of Groups 1–B or 8 to form the catalytic organo-metallic compounds or complexes of this invention.

Conditions for reacting the metals, metal salts or metal oxides of the type described with organic compounds of the type described to form organo-metallic compounds or coordination compounds are well known in the art. The resulting organo-metallics are susceptible of use in a wide variety of ways to effect electroless metal deposition. For example, the organo-metallics may be dissolved in a suitable solvent. It is then only necessary to dip the substratum to be sensitized in the solution of the organo-metallic and permit the substratum to dry, following which it may be contacted with the electroless metal deposition solution, to thereby initiate deposition of the electroless metal.

The catalytic insulating base need not be organic. Thus, it could be made of inorganic insulating materials, e.g., inorganic clays and minerals such as ceramic, ferrite, Carborundum, glass, glass bonded mica, steatite and the like.

Preferred for use as the organo-metallic compound or complex are coordination compounds of ions of the Groups 1–B or 8 metals described with olefins or olefin-like substances, such as those described in "Chemistry of the Coordination Compounds," John C. Bailar, editor, Reinhold Publishing Corp., 1956, chapter 15, pages 487–508. Platinum-olefin compounds, iron-olefin compounds, iridium-olefin compounds, copper-olefin compounds, silver-olefin compounds and palladium-olefin compounds of the type described therein are particularly suitable for use. In the instant specification and claims, wherever the term "metal-olefin" compound is used, it is intended to mean those compounds of metal ions with olefin and olefin-like substances described in the article cited in this paragraph, which article is hereby incorporated herein by reference.

The organo-metallic compounds which may be used in the practice of this invention may, if desired, serve an additional function, e.g., they could serve as an accelerator or curing agent or hardening agent for an organic resin making up or forming a component of the substratum or composition desired to be rendered catalytic. For example, when the composition to be rendered catalytic is epoxy resin, such a result could be accomplished by utilizing, as a curing agent, a metal-amine chelate compound in which the amino nitrogen is held by the metal through a coordinate valence bond. Such chelate compounds are described, for example, in U.S. 2,819,233, the specification of which is incorporated herein by reference. Also may be used metal-amides, metal-polyamides, metal-amido-amines, metal-poly-amido amines and the like.

Metal-amine chelates may be prepared by reacting a polyamine with an inorganic or organic salt or metal of Groups 1–B or 8 of the Periodic Table of Elements to form an amine-metal salt complex or coordinate compound. The active hydrogen atoms of the amine groups are then rendered inactive by the metal toward the reactive epoxide groups of the resinous polyepoxide at room temperature; but upon application of heat or a suitable polar solvent, e.g., water, alcohol, and the like, a number of active hydrogens provided by the amine groups are released and react with a number of epoxide groups, cross-linking the resinous polyepoxide and converting it to its insoluble, infusible state. The amine-metal salt complex-polyepoxide composition has excellent catalytic properties and is stable. The reaction of the amine-metal salt complex with the polyepoxide resin, upon curing, gives unusual properties in the finished products, enabling the production of films or thick sections of excellent solvent resistance, flexibility in the films, hardness and toughness, heat resistance, and adhesion with a minimum amount of active metal-amine chelate.

The metal used in making the amine-metal organic salt complex or chelate compound is one which, when reduced to a salt by an organic acid and reacted with the polyamine, forms a coordinate valence bond holding the nitrogen of the amine groups. Examples of such metals are platinum, palladium, iron, iridium, gold and silver. Examples or organic acids suitable for formation of the metal salt are aliphatic acids such as acetic, hexoic, 2-ethyl hexanoic, and similar mono-functional organic carboxylic acids containing at least two carbon atoms.

Polyamines suitable for reaction with the metal organic salt, to form the complex or chelate compound, are those which in themselves are capable of reacting with epoxide groups through active hydrogens provided by the different amine groups. Such polyamines contain two or more amino nitrogens preferably attached to aliphatic carbon atoms. Examples of such amines include ethylenediamine, propylene diamine, diethylenetriamine, dipropylene triamine, triethylenepentamine, tetrapropylene pentamine, and mixtures of the foregoing. Also may be mentioned higher alkyl polyamines satisfying the above formulae, such as alkyl polyamines in which the alkyl group is butyl, hexyl, octyl and so forth.

Due to their greater availability commercially produced polyfunctional amines may be used with equal success to that obtained using pure amines. Examples of such commercially available amines are those obtained from the Chemical Division of Armour & Company under the trade names "Duomeen O" and "Duomeen S." "Duomeen O" consists essentially of a mixture of N-alkyl trimethylene diamines derived from soya acids.

As previously mentioned, the metal-amine compounds may be made from both inorganic and organic salts of Groups 1–B and 8 of the Periodic Table of Elements. Polyamines, such as diethylenetriamine complexes of the chlorides and acetates of metals from Groups 1–B and 8 are particularly useful. The proportions of the chelate compound and polyepoxide resin may be varied over a wide range; for any selected proportion the complex cures the epoxy resin with a relatively small amount of amine. For most purposes, the ratio of active amine group to epoxy group will be 0.8:1 to 1.2:1, although much higher ratios can be used.

Also useful as the organo-metallic compound for practice of this invention may be mentioned carbonyls of the Group 8 metals, such as the iron carbonyls, and iridium carbonyls. Metal alkyls such as metal diisobutyl, metal triiso butyl, metal triethyl and metal ditoluene, wherein the metal is selected from Groups 1B or 8 of the Periodic Table of Elements may also be used. Also may be mentioned Group 8 metal dibenzenes and Groups 1B and 8 metal dimesitylene diodides. Already mentioned are the metal olefin compounds. Typical of this group are the bis-cyclopentadienyls of a Group 8 metal; also may be mentioned esters, such as acetylacetonates of the metals described. Also may be used metallic-organo hydride compounds, such as metal diethyl hydride and metal dimethyl hydride, wherein the metal is selected from the Groups 1–B and 8 of the Periodic Table of Elements. Nitro organo compounds such as metal nitrosyl carbonyls may also be used. Organo-metallic compounds such as alkyl and aryl metal carbonyls, e.g., benzene metal tricarbonyl, phenathrene metal tricarbonyl, naphthalene metal ortho-tricarbonyls, naphthalene metal tricarbonyl, ortho-xylene metal tricarbonyl, benzene metal tricarbonyl, cyclo-octadiene metal tricarbonyl, bis-cyclopentadienyl chlorides, bromides and diiodides of the metals described herein, cyclopentadienyl metal carbonyls, carbonyl metal halogen such as metal carbonyl bromide, metal carbonyl chloride and the like, may also be used.

Typically, the autocatalytic or electroless metal deposition solutions for use with the catalytic insulating bases and adhesives described comprise an aqueous solution of a water soluble salt of the metal or metals to be deposited, a reducing agent for the metal cations, and a complexing or sequestering agent for the metal cations. The function of the complexing or sequestering agent is to form a water soluble complex with the dissolved metallic cations so as to maintain the metal in solution. The function of the reducing agent is to reduce the metal cation to metal at the appropriate time, as will be made more clear hereinbelow.

Typical of such solutions are electroless copper, electroless nickel and electroless gold solutions. Such solutions are well known in the art and are capable of autocatalytically depositing the identified metals without the use of electricity.

Typical of the electroless copper solutions which may be used are those described in U.S. Pat. 3,095,309, the description of which is incorporated herein by reference. Conventionally, such solutions comprise a source of cupric ions, e.g., copper sulfate, a reducing agent for cupric ions, e.g., formaldehyde, a complexing agent for cupric ions, e.g., tetrasodium ethylenediaminetetraacetic acid, and a pH adjustor, e.g., sodium hydroxide.

Typical electroless nickel baths which may be used are described in Brenner, "Metal Finishing," November 1954, pages 68 to 76, incorporated herein by reference. They comprise aqueous solutions of a nickel salt, such as nickel chloride; an active chemical reducing agent for the nickel salt, such as the hypophosphite ion; and a complexing agent, such as carboxylic acids and salts thereof.

Electroless gold plating baths which may be used are disclosed in U.S. Pat. 2,976,181, hereby incorporated herein by reference. They contain a slightly water soluble gold salt, such as gold cyanide, a reducing agent for the gold salt, such as the hypophosphite ion, and a chelating or complexing agent, such as sodium or potassium cyanide. The hypophosphite ion may be introduced in the form of the acid or salts thereof, such as the sodium, calcium and the ammonium salts. The purpose of the complexing agent is to maintain a relatively small portion of the gold in solution as a water soluble gold complex, permitting a relatively large portion of the gold to remain out of solution as a gold reserve. The pH of the bath will be about 13.5, or between about 13 and 15, and the ion ratio of hypophosphite radical to insoluble gold salt may be between about 0.33 and 10:1.

Specific examples of electroless copper depositing baths suitable for use will now be described:

EXAMPLE 1

| | |
|---|---|
| Copper sulfate | 0.03 |
| Sodium hydroxide | 0.125 |
| Sodium cyanide | 0.0004 |
| Formaldehyde | 0.08 |
| Tetrasodium ethylenediaminetetraacetate | 0.036 |
| Water | Remainder |

This bath is preferably operated at a temperature of about 55° C. and will deposit a coating of ductile electroless copper about 1 mil. thick in about 51 hours.

Other examples of suitable baths are as follows:

EXAMPLE 2

| | Moles/liter |
|---|---|
| Copper sulfate | 0.02 |
| Sodium hydroxide | 0.05 |
| Sodium cyanide | 0.0002 |
| Trisodium N-hydroxyethylethylenediaminetriacetate | 0.032 |
| Formaldehyde | 0.08 |
| Water | Remainder |

This bath is preferably operated at a temperature of about 56° C., and will deposit a coating of ductile electroless copper about 1 mil. thick in 21 hours.

EXAMPLE 3

| | Moles/liter |
|---|---|
| Copper sulfate | 0.05 |
| Diethylenetriaminepentaacetate | 0.05 |
| Sodium borohydride | 0.009 |
| Sodium cyanide | 0.008 |

pH, 13.
Temperature, 25° C.

EXAMPLE 4

| | Moles/liter |
|---|---|
| Copper sulfate | 0.05 |
| N-hydroxyethylethylenediaminetriacetate | 0.115 |
| Sodium cyanide | 0.0016 |
| Sodium borohydride | 0.008 |

pH, 13.
Temperature, 25° C.

Utilizing the electroless metal baths of the type described, very thin conducting metal films may be laid down. Ordinarily, the metal films superimposed by electroless metal deposition will range from 0.1 to 7 mils. in thickness, with metal films having a thickness of even less than 0.1 mil. being a distinct possibility.

The organo-metallics may be added to photoresists which may in turn be used to coat a substratum which is desired to be metallized. The photoresist may then be photo printed, and following development, the substratum is immersed in an electroless metal deposition solution to metallize the area of the resist still remaining intact following development.

As already brought out, the organo-metallic compounds may be dissolved in a solvent, and the solution then used for seeding purposes.

As has been described, the organo-metallics, in addition to being highly useful for seedling plastic substrate, as by immersion, are also suitable for impregnating coating materials, such as photoresists, to render such compositions catalytic to the initiation of electroless copper deposition. The organo-metallics may also be mixed with the solid catalytic agent systems of the type described in co-pending application Ser. No. 249,063, now U.S. Pat. 3,226,256, to make such systems more responsive to electroless metal deposition.

The organo-metallic compounds of this invention may also be mixed with a resin binder to form a catalytic ink. In use of such systems, the substrata need only be immersed in or sprayed with the resin binder containing the organo-metallic to deposit on the substratum a minor amount of resin containing therein the catalytic agent. Suitable solvents may be used in this system when required.

EXAMPLE 5

An adhesive binder was prepared according to the following formulation:

| | Grams/liter |
|---|---|
| Ethylene glycol monoethyl ether acetate (Cellosolve acetate) | 600 |
| Epoxy resin (ERL 2256) | 109 |
| Acrylonitrile butadiene (Hycar 1312) | 20 |
| Phenolic resin (SP 100) | 20 |
| Phenolic resin (SP 126) | 20 |
| Phenolic resin (SP 6600) | 20 |
| Acrylonitrile butadiene (Paracil CV) | 144 |
| Silicon dioxide (Cab-O-Sil) | 50 |
| Wetting agent (Igepal 430) | 17.5 |

EXAMPLE 6

An organic metallic compound was prepared by mixing the following composition:

| | Grams |
|---|---|
| Diallyl phthalate | 10 |
| Palladium chloride | 0.2 |
| Tertiary butyl perbenzoate | 0.1–0.2 |

The composition was heated to 185° C. for 3 minutes. After cooling, the resulting organo-metallic compound was added to the adhesive binder of Example 6 in an amount sufficient to produce a composition containing 0.2% palladium by weight. The resulting product when exposed to a copper electroless deposition solution of the type described in Example 1 was highly catalytic to the deposition of electroless copper.

EXAMPLE 7

An organo-metallic compound was prepared from the following composition:

| | Parts by weight |
|---|---|
| Epoxy resin (Epon 826) | 400 |
| Dimethyl formamide | 70 |
| Tertiary butyl perbenzoate | 1.5 |
| Palladium chloride | 8 |

The first three components of the formula were heated to 50° C. following which the palladium chloride was added. The admixture was then heated slowly to 130° C. and held at that temperature for 15 minutes following which it was cooled. The resulting organo-metallic compound was incorporated into epoxy resin, Epon 828, in an amount such that the epoxy resin contained 0.2% palladium by weight. The resulting epoxy resin when exposed to an electroless deposition solution of the type described hereinabove in Example 1, received a deposit of electroless copper both on the surface and on walls surrounding apertures which were pre-formed in the resin.

EXAMPLE 8

An organo-metallic chelate was prepared by dispersing 1 gram of palladium chloride in 30 milliliters triethylene tetramine. The resulting chelate was used as an epoxy curing agent in the following composition:

| | Grams |
|---|---|
| Epoxy resin (Epon 828) | 16.5 |
| Palladium chloride-triethylenetetramine chelate | 2.5 |

The resulting epoxy composition was catalytic to the reception of electroless copper.

EXAMPLE 9

Example 8 was repeated with the exception that diethylaminopropylamine (DEAPA) was substituted for triethylenetetramine (TETA). Similar results were obtained.

The organo-metallic compounds of the type described may be used in still other ways. For example, they could be conveniently used to impregnate paper, wood, Fiberglas cloth, finely divided clays and fillers, polyester fibers, and other porous solid materials to render such insulating solid materials catalytic to the reception of electroless copper. Such base materials, for example, could be immersed in a solution of the organo-metallic compound, then dried to evaporate the solvent, leaving the catalytic organo-metallic compound throughout the interior as well as on the surface of the porous material. The resulting catalytic materials could then be incorporated into resins to produce a wide variety of catalytic substrata, the interior portions of which would be receptive to the deposition of electroless metal. Thus, if holes were drilled in the resulting substrata, electroless metal would deposit on the walls surrounding the holes, since the entire interior of the substratum, as well as the surface, would be catalytic.

The catalytic organic metallic compounds could also be used as an ink to paint the surface areas on which electroless metal is to be deposited.

The insulating base members on which electroless metal is to be deposited are most frequently formed of resinous material. When this is the case, the organo-metallic compounds disclosed herein could be dissolved into a resin after which the resin could be set to form the base. Alternatively, a thin film or strip of unpolymerized resin having dissolved therein the organo-metallic compounds of this invention could be pre-formed or pre-molded, and then laminated to a resinous insulating base, and cured thereon. In this embodiment, the insulating base could for example be made up of laminates, e.g., resin impregnated paper sheets, resin impregnated Fiberglas sheets, and the like.

In still a further embodiment, a resinous ink having the catalytic compound dissolved therein could be printed on the surface, as by silk screen printing, of an insulating support and cured thereon.

A particularly important embodiment of the invention is that wherein the catalytically active organic-metallic compound is dissolved or dispersed in a resin which may in turn be formed into a three-dimensional object, as by molding. In this embodiment, the entire composition including the interior is catalytic. When such an article, containing apertures extending below the surface thereof, is subjected to an electroless metal deposition solution, electroless metal deposits not only on the exposed portions of the surface of the article, but also on the walls surrounding the apertures. This embodiment is especially suitable for making printed circuit patterns having plated through holes, i.e., holes having surrounding walls which are plated with metal to form through connections between a surface supporting a printed circuit pattern, and the interior of the substratum supporting the circuit pattern. Alternatively, in making printed circuits from the molded embodiment of the invention, interconnecting holes could be bored into the catalytically active article, and then the article subjected to an electroless copper deposition, to thereby deposit copper on the walls surrounding the holes. Following electroless copper deposition, the interconnecting holes, which are now metallized, form a conducting pattern which may be limited to the interior portion of the article.

Using the organo-metallic materials of the present invention, printed circuits may be made by employing either the direct or reverse printing technique, since the organometallics are non-conducting.

To summarize, the organo-metallics of this invention could be used as additives to render photoresists sensitive to electroless metal deposition; as a pre-treatment composition whenever and wherever metallization of insulating substrata is desired; as impregnants for porous plastics to be metallized; as an impregnant for ceramics or clays to be metallized; in the form of sensitizer-seeder solution for sensitizing insulating substrata to the reception of electroless metal; as an activator and penetrant for solid particles, which in turn are incorporated into insulating material in the form of an ink or a coating composition. With appropriate solvents, the organometallics of this invention could also serve as wash sensitizers and penetrants for thermoplastic adhesives, such as acrylonitrile-butadiene-styrene acrylics, vinyls, etc., to render these thermoplastic materials receptive to the deposition of electroless metal.

Following the teachings contained herein there may be provided a blank for the manufacture of printed circuits which comprises an insulating base material which is formed in whole or in part of an insulating organo-metallic compound which is catalytic to the reception of electroless metal. In a preferred embodiment, a thin metal film is superimposed on one or more surfaces of the base and adhered thereto.

Blanks of the type described could be used to prepare one-layer, two-layer and multi-layer printed circuit boards with and without plated through holes in the manner more particularly described in co-pending application Ser. No. 561,123, filed June 28, 1966 and now abandoned.

Figure 1:
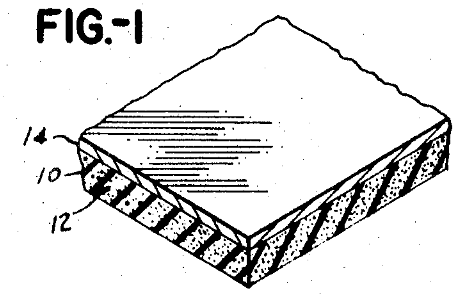
FIGS. 1 and 2 are three-dimensional views of certain embodiments of the blanks of this invention.
Figure 2:
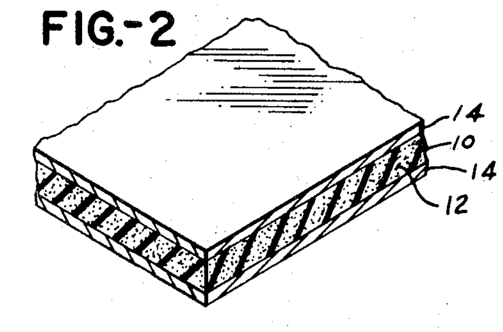
Figure 3:
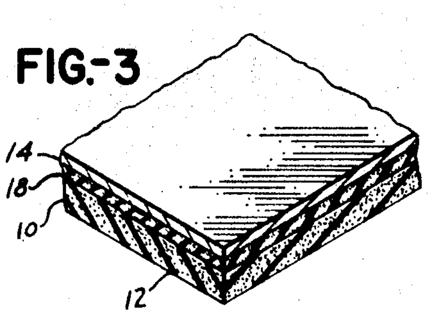
FIGS. 3 and 4 are cross-sectional views of further embodiments of the catalytic blanks of this invention.
Figure 4:
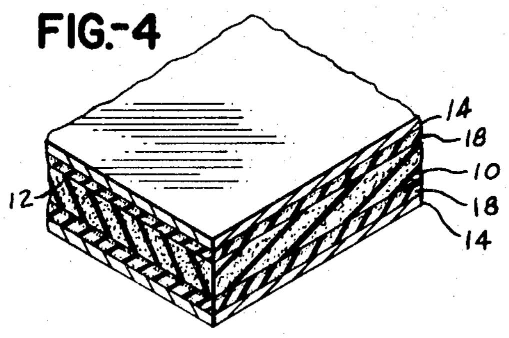
Figure 6:
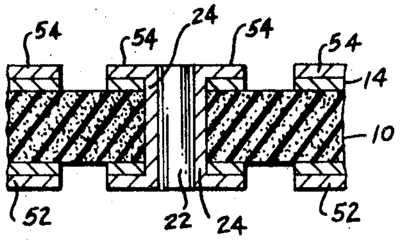
Figure 7:
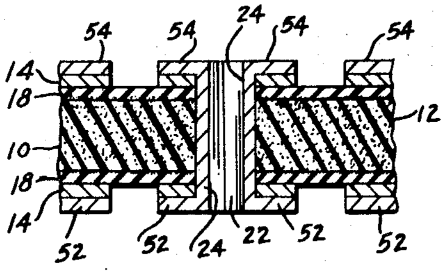
Figure 8:
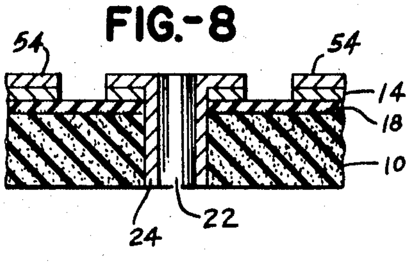

FIGS. 5A–F is a schematic illustration of the steps utilized in making a one-sided printed circuit board from the blank of FIG. 1;

FIGS. 6 and 7 are cross-sectional views of typical embodiments of two-sides plated through hole printed circuit boards produced in accordance with this invention utilizing the blanks of FIGS. 2 and 4, respectively; and FIG. 8 is a cross-sectional view of a one-sided plated through hole circuit board manufactured from the blank of FIG. 3.

In FIG. 1 is shown a blank which comprises, in its simplest form, an insulating base 10 having distributed therein an organo-metallic agent of the type described which is catalytic to the reception of electroless metal from an electroless metal deposition solution. Hereinafter whenever the term "catalytic" is employed it will refer to the organo-metallic agents described hereinabove.

The catalytic agent 12 may be dissolved in or dispersed throughout the base 10. Alternatively, the insulating base material itself may be catalytic to the reception of electroless metal, e.g., the insulating base material may be formed in whole or in part of an insulating organo-metallic compound which is catalytic to the reception of electroless metal. Superimposed on the base 10 and adhered thereto is a thin unitary and integral metal film or laminate 14 which preferably covers and is substantially conterminous with, i.e., has the same boundaries as, the surface of base 10. The thickness of the metal film 14 will depend primarily upon the manner in which it is fabricated and bonded to the base 10, and will also depend upon the ultimate use to which the blank is to be put. Typically, the metal film will have a thickness of between about 0.05 micron and 200 microns. In a preferred embodiment, the metal film 14 is copper. The thickness of the metal film 14 when made of copper will preferably be such that its weight will vary between about 0.03 and 2 ounces per square foot.

When the metal film 14 is superimposed on the base 10 by means of conventional metal cladding techniques, i.e., by preforming a thin foil of metal, e.g., by electrolytic deposition, and laminating it to the base, the foil 14 will have a thickness of at least about 17 microns. On the other hand, if the metal film is produced by vapor deposition or by the electroless chemical metal deposition technique described herein, it can be as thin as 0.05 micron.

In accordance with a preferred embodiment of the present invention, the film 14 is produced by electroless metal deposition, preferably electroless copper deposition, and has a thickness of between about 0.05 and 30 microns, preferably between about 0.1 and 10 microns. Thin films of the type disclosed having a thickness of less than 5 microns and preferably between 2 and 4 microns, have the ability to be quick etched, as described hereinbelow.

In FIG. 2, there is shown an embodiment of the blank which comprises an insulating member 10 containing a catalytic agent 12. Adhered to both surfaces of the base are thin unitary metal films 14.

FIGS. 3 and 4 illustrate modified embodiments of the blank shown in FIGS. 1 and 2. Thus, in FIG. 3 the catalytic base 10 has superimposed thereon an insulating adhesive resin 18 which is itself catalytic to the reception of electroless metal. The adhesive resin 18 has dissolved therein or dispersed therein a catalytic agent. Alternatively, the adhesive resin 18 may be formed in whole or in part of an insulating organo-metallic compound which is itself catalytic to the reception of electroless metal. The thin layer of metal 14 is adhered to the base 10 by the catalytic adhesive 18.

Similarly, in FIG. 4, the catalytic base 10 is coated on both surfaces with an adhesive 18, which is catalytic, and thin metal films 14 are adhered to both surfaces of base 10 by the adhesive 18.

When certain forms of catalytic agent, e.g., solid particles, are used to prepare the catalytic base 10, there is a tendency for the surface layers of the base 10 to be rich in resin and low in catalyst. As a result, depending upon how the base 10 is manufactured, it sometimes happens that the surface of the base is non-catalytic, even though the interior of base 10 is highly catalytic. This situation is remedied by coating one or both surfaces of the base 10 with a catalytic adhesive 18, as shown in FIGS. 3 and 4. Alternatively, such surfaces could be rendered catalytically active by treatment with acids. Especially suitable are oxidizing acids such as sulfuric, nitric and chromic acids, including mixtures of the foregoing. Treatment with such acids not only renders the surface catalytically active, but it also frequently serves to considerably enhance the bond between the surface and electroless metal deposited thereon.

Figure 5:
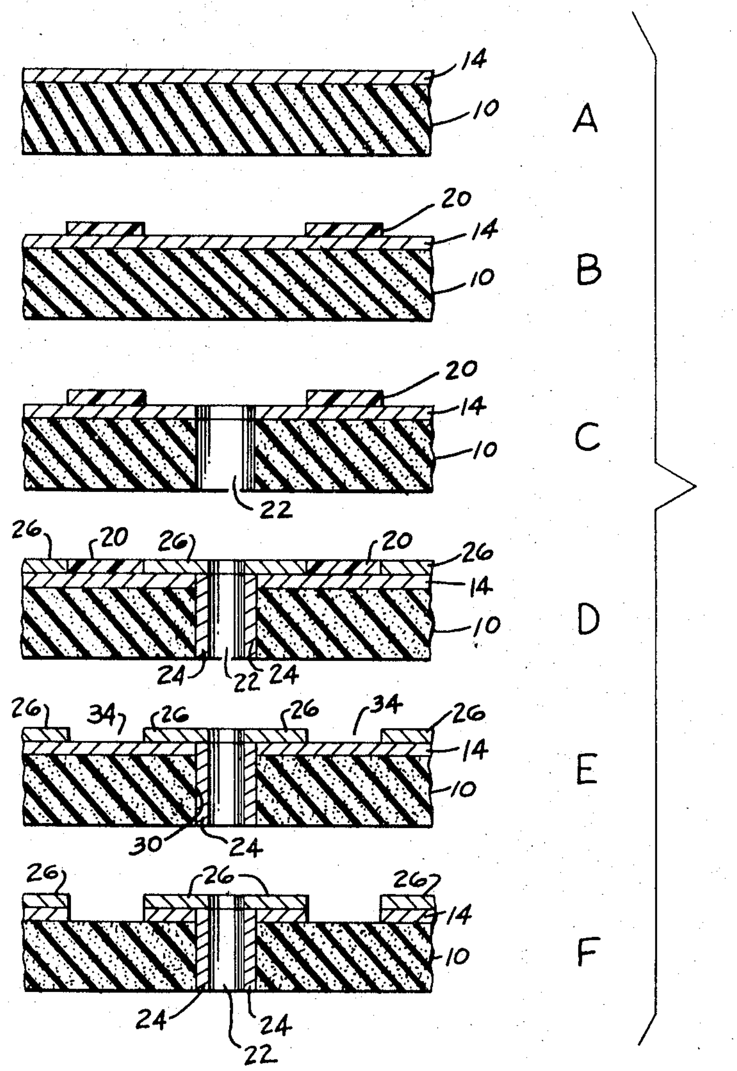

FIG. 5 illustrates the steps to be used in the manufacture of a one-sided plated through hole board from the blank shown in FIG. 1.

FIG. 5A illustrates the starting blank comprising a catalytic base 10 having a thin metal film 14 adhered to the upper surface. The thin metal film may but need not be conterminous with the upper surface.

In FIG. 5B, a negative resin mask 20 has been printed onto the metal foil 14 to leave exposed a positive pattern of the desired printed circuit. At C, FIG. 5, a hole 22 has been provided as by punching or drilling through the foil 14 and base 10, at an interconnecting point of the desired circuit. The blank as it appears in FIG. 5C is then immersed in an electroless metal plating bath of the type described herein to deposit metal 26 on the wall 30 of hole 22. Additional metal 26 deposits on the surface of the metal film 14 which is not covered by the mask 20. If desired, an electrode may be attached to the board after the wall 24 has been formed by electroless deposition, and the circuit pattern and hole walls built up by conventional electrolytic deposition of metal. Following buildup of the circuit to desired thickness either by electroless or electrolytic deposition, the blank is treated with a suitable solvent to remove the mask 20. The blank, following removal of the mask 20, is depicted in FIG. 5E. Finally, the panel is subjected to an etching solution, e.g., ferric chloride, ammonium persulfate, and the like, when the metal film 14 is copper, to thereby remove the thin film of copper 34 which was initially covered by the mask 20. Note that if the metal film 14 is thin, e.g., less than 10% the thickness of the desired circuit pattern, there will be no need to mask the circuit pattern 26 or the plating 24 on the hole walls 30 during the etching step, because the film of metal 14 is so extremely thin compared with the circuit pattern 26 that it will be removed before any substantial etching of circuit 26 or plated wall 24 occurs. Of course, if the initial metal film 14 is thick, the circuit 26 and wall 30 will have to be masked prior to the etching operation.

The etching operation may be carried out by either blasting the surface of the panel with a fine spray of etchant solution or by immersing the panels, which are held in a rack or on a conveyor, in an agitated tank of etchant. During etching, the concentration of the etching solution and the time of contact will be controlled to insure complete removal of the thin layer of copper foil in the areas 34. After etching, the panel should be water rinsed to remove all etching chemicals to thereby prevent contamination of the surface or edges of the panels. If desired, the circuit pattern may be plated with additional metals, such as silver, nickel, rhodium, gold or similar high wear resistant materials for special applications. When it is necessary to solder lugs or other hardware to the pattern, it is advisable to solder plate the conductive pattern.

The procedure described above and illustrated in FIG. 5 may also be used to prepare a two-sided, plated through hole printed circuit board of the type shown in FIG. 6, starting with a blank of the type shown in FIG. 2. As shown in FIG. 6, the circuit board comprises a catalytic base 10 having circuit patterns 52 and 54 superimposed on the lower and upper surfaces, respectively. Through connections between the circuit patterns is provided by hole 22, the lateral wall of which is coated with metal 24.

The one-sided plated through hole board of FIG. 8 is prepared by applying the technique illustrated in FIG. 5 and described above to the blank of FIG. 3.

Likewise, the two-sided plated through hole board shown in FIG. 7 is prepared by applying the procedure of FIG. 5 to the blank shown in FIG. 4. In FIG. 7, circuits 52 and 54 on the lower and upper surfaces, respectively, of catalytic base 10 are connected via plated through hole 22, the lateral walls of which are coated with electroless metal 24.

As will be appreciated from the foregoing, all of the blanks described herein may be used to form metallized insulating substrates directly on insulating base materials without the necessity of seeding the insulating material prior to metallization.

A distinct advantage of these blanks in printed circuit manufacture is that they can be used to produce directly rugged and reliable printed circuit boards having plated through holes. Use of such blanks eliminates the pre-seeding and/or pre-sensitizing steps of conventional practice together with the concomitant problems associated with such practice.

Catalytic insulating bases containing non-catalytic surfaces may be made in a variety of ways. Thus, the catalytic insulating base could be made with a minimal amount of catalytic agent to insure that the surface of the base is extremely rich in insulating and extremely poor in catalyst. When formed, such a base, or laminates impregnated with such a base, will have surfaces which are substantially non-catalytic to the deposition of electroless metal.

Alternatively, a catalytic insulating base rich in catalyst could be prepared and one or both surfaces thereon then coated with a non-catalytic insulating film or adhesive. For example, when the catalytic base is made by impregnating paper or fibrous substrata, e.g., Fiberglas, with catalytic resin, a final gel coat of non-catalytic resin could be superimposed on the laminated structure during manufacture to produce the non-catalytic surface. Alternatively, a film of non-catalytic resin could be bonded to the substrata following completion of lamination.

In the manufacture of the catalytic base materials and adhesives described, an agent which is catalytic to the reception of electroless metal is distributed throughout an insulating base or adhesive, as by dissolution, dispersion, or by reacting a part or all of the material of the base or adhesive with a catalytic agent so as to form a chemical compound or complex, which is itself catalytic to the reception of electroless metal. The resulting base or adhesive will be catalytic to the reception of electroless metal throughout its interior.

Exposed surfaces of the catalytic base materials of this invention are catalytic to the reception of electroless metal, or may be rendered catalytic by subjecting the surface to relatively mild mechanical or chemical abrasion or etching or by coating the surface with catalytic adhesives of the type described.

A film of metal as shown in FIGS. 1–4, accordingly, may be readily superimposed on such a base simply by immersing the base in an electroless metal deposition solution of the type to be described. Alternatively, the catalytic base could actually be clad with a thin metal foil, using typical metal cladding or lamination techniques, e.g., by bonding a thin foil of metal to the base.

A printed pattern may be formed on the metal clad blanks of this invention in a variety of ways.

In the so-called photographic technique, the surface is cleaned and degreased, and a light sensitive enamel is uniformly spread over the metal foil and dried.

The photographic system of printing could also be used to produce the mask in the additive process for producing a circuit pattern by electroless metal deposition techniques described hereinabove. Whenever required, the light sensitive enamel could be made catalytic to the reception of electroless metal by dissolving or dispersing therein an agent which is catalytic to the reception of electroless metal.

For long production runs, the photographic system of printing tends to be slow and expensive, and as a result, etch resist printing will ordinarily be carried out either by offset printing on an offset printing press or by screen stencil printing on a manual or automatically operative screen printing press. The step and repeat negative is used to produce, in the case of an offset printing press, an offset printing plate. Acid resist ink is transferred by a rubber covered roll from the printing plate to the metal clad base.

In screen printing, the step and repeat negative is used to produce a stencil on the silk or wire mesh of the screen frame. The stencil is made photographically from the negative and reproduces it exactly.

Regardless of the type of printing employed, it will be understood that either a positive or a negative image of the desired conducting patterns may be imposed on the base, with suitable modifications to insure that the final conductive pattern desired is ultimately obtained.

When offset or screen stencil printing is employed, the ink used in printing is acid resistant, so that the portions of the metal foil covered thereby are not affected by the etching solution when the plate is contacted therewith. Such acid resistant inks are well understood in the art, and commonly comprise resins such as cellulose acetate, cellulose butyrate, casein-formaldehyde, styrene-maleic anhydride, and the like. Such materials are acid resistant but can be readily removed when desired by readily available solvents or otherwise.

One etching solution commonly used with copper clad stock is ferric chloride. The etching operation is carried out by either blasting the surface of the panel with a fine spray of ferric chloride or immersing the printed sheets, which are held in a rack or on a conveyor, in an agitated tank of ferric chloride. The etching operation is controlled by the concentration of the etching solution and time of contact, and these variables must be carefully controlled empirically for good results. After etching, a water rinsing process is employed to remove all etching chemicals, thereby preventing contamination of the surface or edges of the panel.

Frequently, a bare copper foil circuit is not adequate. If, for example, the circuit pattern is to be used as a switch, slip ring, or commutator, it may be necessary to plate the circuit pattern with silver, nickel, rhodium, gold and similar highly wear resistant metals. Where it is necessary to solder lugs or other hardware to the pattern, it may be advisable to have the conductor pattern solder plated.

It will be understood that in the metal clad or otherwise metal coated blanks of the type described in FIGS. 1–4, and referred to throughout the specification, the metal layer may be any of the well known conductive metals, including copper, silver, gold, nickel, rhodium, aluminum and the like, including mixtures or alloys of such metals. Copper, aluminum, nickel and silver are particularly preferred.

For metallization of plastics, as distinguished from printed circuit manufacture, a preferred blank consists of an inexpensive insulating base whose interior is non-catalytic, having a catalytic gel or other type of catalytic coating on one or both surfaces. The catalytic skin or coating could be molded or extruded on one or both surfaces of the insulating non-catalytic base. When necessary, such an article could be treated to activate the catalytic surface portion, such as by treatment with an oxidation or degradation agent, such as sulfuric acid, chromic acid, permanganate, and the like. Particularly suitable is an aqueous mixture of sulfuric and chromic acid. Treatment with such materials produces micropores in the surface of the catalytic film or layer, and exposes the catalyst for contact with an electroless metal deposition solution. Such micropores also enhance the adhesion between the catalytic base and the electroless metal deposited thereon. The electroless metal may be electroless copper, electroless nickel, electroless silver, electroless gold or the like. Use of this blank accordingly would result in the economical production of metallized plastic articles, since the costly catalytic agents described herein need to be used only in thin surface films or layers on a surface or surfaces of the articles.

Such articles could be manufactured for example by an extrusion process. Here, the catalytic material could be extruded simultaneously as a skin over an insulating, non-catalytic base. Alternatively, a molding process could be employed wherein the catalytic film could be separately or simultaneously molded over an insulating non-catalytic base. In articles of this type, the insulating base and the skin or surface film could either be the same as or a different resin system. When the base and the skin portions are made of the same resin system, there is no distinction and no discontinuity between the catalytic and non-catalytic portions of the molded or extrusion base. The non-catalytic, insulating core of the articles under discussion is preferably made of cheap, readily available resins or plastics, such as acrylonitrile-butadiene-styrene (ABS), polyesters, phenolics such as phenol formaldehyde, and the like. Obviously, however, the insulating base could be any of the resins described hereinabove as suitable for producing insulating blanks. Similarly, the catalytic film or layer could be any such resins or resin systems described hereinabove having dispersed therein a catalytic agent of the type described. The catalytic film or layer could, for instance, correspond to the resin formulations given in any of the preceding examples.

It should also be brought out that inks containing the catalytic agents described herein could be used to produce printed circuit patterns by printing a positive design of the pattern on non-catalytic surfaces, and then subjecting the base to electroless metal deposition. These catalytic agent containing inks have the advantage of being non-conducting, as already brought out.

What is claimed is:

1. A method for rendering insulating compositions receptive to the deposition of electroless metal which comprises utilizing in such compositions a catalytic compound of a metal, said compound being a member selected from the group consisting of metal-olefin coordination compounds; metal chelates of amines, polyamines, polyamides or amido-amines and poly-amidoamines; metal carbonyls; metal alkyls; metal esters; and metal hydrides, wherein the metal component of said compound is a member selected from the metals in Groups 1–B and 8 of the Periodic Table of Elements, including mixtures of such compounds.

2. The method of claim 1 wherein the metal component is a member selected from the group consisting of gold, silver, palladium, platinum, iridium, copper and rhodium.

3. The method of claim 1 wherein the insulating composition comprises an epoxy resin, and wherein said catalytic compound is a chelate of a metal selected from Groups 1–B and 8 of the Periodic Table of Elements, with a member selected from the group consisting of amines, polyamines, amides, polyamides, amino-amines, and poly-amido-amines, said chelate being capable of curing the epoxy resin.

4. The method of claim 1 wherein said catalytic compound is a coordinate compound of a metal selected from Groups 1–B and 8 of the Periodic Table of Elements with an olefin.

5. The method of claim 1 wherein the insulating composition comprises an insulating molded resin substratum, the interior of which is catalytic to the reception of electroless metal.

6. The method of claim 1 wherein the insulating composition is a member selected from the group consisting of thermosetting resins, thermoplastic resins and mixtures of the foregoing.

7. The method of claim 1 wherein the composition comprises in combination a thermosetting resin and a flexible adhesive resin.

8. The method of claim 1 wherein the insulating composition is a photoresist composition.

9. The method of claim 1 wherein the insulating composition is a resinous ink containing said catalytic compound.

10. The method of claim 1 wherein said catalytic compound is adsorbed on a porous solid material which forms a component of the insulating composition.

11. The method of claim 1 wherein the insulating composition which includes said catalytic compound is provided with a thin film of metal on at least one surface thereof.

12. The method of claim 1 wherein the insulating composition including said catalytic compound, is provided with an aperture extending from at least one surface into the interior of the component, the walls of said aperture being receptive to the reception of electroless metal upon contact of the walls to an electroless metal deposition solution.

13. The method of claim 1 wherein said catalytic compound is present in an amount of 0.001 and 10% by weight of the insulating composition.

14. The method of claim 1 wherein the insulating composition is itself said catalytic compound.

15. A three-dimensional article comprising an insulating material which contains a catalytic compound as defined in claim 1, both the surface and interior portion of said article being catalytic to the deposition of electroless metal, at least a surface portion of said article having adhered thereto a thin film of metal.

16. The article of claim 15 wherein the thin metal film is a thin film of electroless metal.

17. A three-dimensional article comprising an insulating material containing a catalytic compound as defined in claim 1, said article being provided with an aperture extending from one surface into the interior, the lateral walls surrounding the aperture being catalytic to the deposition of electroless metal.

18. The article of claim 17 wherein at least a surface portion of said article has adhered thereto a thin film of metal.

19. The article of claim 18 wherein the thin metal film is a thin film of electroless metal.

20. A three-dimensional article comprising an insulating base, the interior of which is non-catalytic to the reception of electroless metal, said base having a surface layer which is catalytic to the reception of electroless metal, the catalytic properties of said layer being attributable to the presence therein of a catalytic compound as defined in claim 1.

21. The article of claim 20 wherein the base comprises acrylonitrile-butadiene-styrene resin.

References Cited

UNITED STATES PATENTS

| | | | |
|---|---|---|---|
| 3,171,756 | 3/1965 | Marshall ____________ | 117—212 |
| 3,259,559 | 7/1966 | Schneble et al. ______ | 117—213 |

OTHER REFERENCES

IBM Tech. Disclosure Bulletin, "Haines," vol. 8, No. 9, February 1966.

WILLIAM L. JARVIS, Primary Examiner

U.S. Cl. X.R.

117—213, 47, 227; 106—1; 252—514, 431, 472; 174—68.5

PO-1050
(5/69)

UNITED STATES PATENT OFFICE
CERTIFICATE OF CORRECTION

Patent No. 3,560,257 Dated February 2, 1971

Inventor(s) Frederick W. Schneble, Jr., Edward J. Leech and Joseph Polichette

It is certified that error appears in the above-identified patent and that said Letters Patent are hereby corrected as shown below:

Column 15, line 58, "amino-amines" should read -- amido-amines --.

Signed and sealed this 19th day of October 1971.

(SEAL)
Attest:

EDWARD M.FLETCHER,JR.
Attesting Officer

ROBERT GOTTSCHALK
Acting Commissioner of Patent